United States Patent
Xia

(10) Patent No.: US 7,868,556 B2
(45) Date of Patent: Jan. 11, 2011

(54) RF MATCHING NETWORK OF A VACUUM PROCESSING CHAMBER AND CORRESPONDING CONFIGURATION METHODS

(75) Inventor: Yaomin Xia, San Jose, CA (US)

(73) Assignee: Advanced Micro-Fabrication Equipment, Inc. Asia, George Town, Grand Cayman (KY)

( * ) Notice: Subject to any disclaimer, the term of this patent is extended or adjusted under 35 U.S.C. 154(b) by 1351 days.

(21) Appl. No.: 11/350,022

(22) Filed: Feb. 8, 2006

(65) Prior Publication Data

US 2007/0030091 A1 Feb. 8, 2007

(30) Foreign Application Priority Data

Aug. 5, 2005 (CN) .................... 2005 1 0028564

(51) Int. Cl.
*H05B 31/26* (2006.01)
(52) U.S. Cl. .................... 315/111.21; 315/111.51; 315/111.71
(58) Field of Classification Search .............. 315/111.01–111.91; 156/345.28, 345.43, 345.44, 156/345.47
See application file for complete search history.

(56) References Cited

U.S. PATENT DOCUMENTS

| | | | |
|---|---|---|---|
| 5,543,689 A * | 8/1996 | Ohta et al. ............. | 315/111.21 |
| 5,872,456 A | 2/1999 | Roderick et al. | |
| 7,405,521 B2 * | 7/2008 | Dhindsa et al. ........ | 315/111.21 |
| 7,692,389 B2 * | 4/2010 | Kirchmeier ............ | 315/111.21 |
| 2004/0027209 A1 | 2/2004 | Chen et al. | |
| 2005/0133163 A1 * | 6/2005 | Shannon et al. ........ | 156/345.44 |
| 2005/0168152 A1 * | 8/2005 | Blackburn et al. ..... | 315/111.21 |
| 2005/0264218 A1 * | 12/2005 | Dhindsa et al. ........ | 315/111.21 |

* cited by examiner

*Primary Examiner*—Douglas W Owens
*Assistant Examiner*—Tung X Le
(74) *Attorney, Agent, or Firm*—Joseph Bach, Esq.; Nixon Peabody, LLP.

(57) ABSTRACT

A RF matching network is described, and which includes a $1^{st}$ to nth RF generators, and wherein each RF generator has a different frequency, and wherein the frequencies of the $1^{st}$ to the nth RF input ports decline in sequence, and wherein between the ith frequency RF input port, and the output port is a ith circuit, which has a high impedance at the output port to all RF generator frequencies other than the ith frequency; and wherein the ith circuit, when connected to a RF generator with the ith frequency, and wherein measuring from the output port to the ith circuit, the ith circuit has a first impedance at the ith frequency; and when measuring from the output port in the opposite direction to the ith circuit, the ith circuit has a second impedance at the ith frequency; and wherein the first impedance is a substantial conjugate match of the second impedance.

27 Claims, 6 Drawing Sheets

RF MATCHING NETWORK OF A VACUUM PROCESSING CHAMBER AND CORRESPONDING CONFIGURATION METHODS

RELATED PATENT DATA

This application claims priority from Chinese Patent Application Serial No. 200510028564.7, and which was filed on Aug. 5, 2005.

TECHNICAL FIELD

The present invention relates to the field of semiconductor and/or integrated circuit manufacturing, and more specifically to a RF matching network which is useful with a vacuum processing chamber, and corresponding methods of employing same.

BACKGROUND OF THE INVENTION

The operation of a vacuum processing chamber are well known. In this regard, reaction gases are introduced to the vacuum processing chamber, and then RF energy is delivered into the vacuum processing chamber. This RF energy activates or energizes the reaction gas, thereby forming a resulting plasma in the vacuum processing chamber. This plasma is then used to process a semiconductor workpiece which is placed in same. Heretofore, one of the previous practices was to input RF energy of a single frequency onto the lower electrode of the vacuum processing chamber, for example, 13.56 MHz.

Other developments have been made with respect to plasma processing technology for semiconductor workpieces. For example, dual frequency energy input technology has recently been applied to the activation or energizing of reaction gases in the vacuum processing chamber. This technology has enhanced the processing performance of the plasma with respect to the semiconductor workpieces. In this regard, the dual frequency energy inputted at two different frequencies substantially simultaneously into the vacuum processing chamber. For example, in the present invention, a dual frequency combination of 2 MHz, and 60 MHz may be employed.

When inputting RF energy into a vacuum processing chamber, not all RF energies can be inputted without difficulty. One difficulty which arises is that the vacuum processing chamber has a capacitive impedance which exists between the upper and lower electrodes. As a result, a certain reflection ratio to the RF energy input occurs. Consequently, a portion of the RF energy will typically feed back to the input circuit. This usually causes the input circuit to overheat or even become damaged. Moreover, the vacuum processing chamber is equivalent to a load of capacitive impedance relative to the RF generator. Therefore, its impedance is a complex number. Theoretically speaking, when the capacitive impedance is a conjugate match to the impedance of the input circuit, the reflection ratio is minimized and the RF energy can be inputted satisfactorily. Therefore, proper capacitors and inductors are typically inserted into the input network to subsequently form a conjugate match with the capacitive impedance of the vacuum processing chamber. This kind of input network comprising capacitors and inductors has typically been referred to in the art has a RF matching network.

While RF matching networks have worked with varying degrees of success, many shortcomings are attendant with their use. For example, as the high frequency and low frequency inputs are simultaneously connected to the vacuum processing chamber, the corresponding RF matching network becomes electrically coupled to the vacuum processing chamber. Typically, the inputs of the high frequency and low frequency join at one point or location, and a portion of this energy usually does not go into the vacuum processing chamber, but rather the energy travels to each of the RF generators where it damages same. Therefore, a need exists to isolate the RF matching network of the vacuum processing chamber from the high frequency and low frequency inputs. Heretofore, the degree of isolation reached by such RF matching networks have been equal to the power ratio of energy inputted into the RF matching network of the vacuum processing chamber to the energy inputted into the vacuum processing chamber which is about −20 db, or about 1%.

Based upon the great discrepancy between the frequencies which may be provided by the two RF generators, one way to address this problem is to set up a filter before the connection point of each RF matching network, that is, a high frequency notch or filter at the low frequency side, and a low frequency notch or filter at the high frequency side. Thus, the RF energy inputted into the RF matching network provided by each RF generator is filtered.

This solution, while working with some degree of success, has at least two shortcomings. As a first matter, direct filtering of energy causes a great loss of energy, and further reduces the input efficiency. Secondly, filtering of energy will typically cause the notch or filter to heat up. Moreover, large filters are needed for the filtering of high power energy, thus increasing the volume and weight of the resulting equipment, and the costs associated with the design and manufacturing of the same equipment.

SUMMARY OF THE INVENTION

One aspect of the present invention is to provide a vacuum processing chamber that can overcome the problems associated with the isolation which must be established between multiple RF generators. The present invention focuses on solving the problem of heating or even the burning up of such generators caused by power transmission between high frequency and low frequency RF generators.

This aspect of the present invention can be realized by the following teachings. In this regard, the present invention includes an RF matching network for use with a vacuum processing chamber which comprises, $1^{st}$ to nth RF input ports connected respectively with $1^{st}$ to nth RF generators, and wherein each of the RF generators have a different frequency, and an output port that outputs the energy of the multiple RF generators to the vacuum processing chamber, and wherein the frequencies of the $1^{st}$ to the nth RF input ports decline in sequence. Between the ith frequency RF input port, and the output port, is an ith circuit. In the present invention, the ith circuit has a high impedance at the output port to all RF generator frequencies other than the ith frequency. Still further, when the ith circuit is connected to the RF generator with the ith frequency, and further when measuring from the output port to the ith circuit, the ith circuit has a first impedance at the ith frequency; and wherein measuring from the output port in the opposite direction to the ith circuit, it has a second impedance at the ith frequency. In the present invention, there is a substantial conjugate match between the first impedance and the second impedance.

Between two neighboring frequencies, the ratio of the high frequency to the low frequency is greater than or equal to 5. Each of the circuits comprise at least a capacitor, an inductor, and a grounding capacitor, and wherein the capacitor is in series with the inductor, and further electrically connected in series with the grounding capacitor. The electrical connection of each circuit can be a L-type, inverse-L type, T-type, or π-type. In the present invention, n is an integer larger than or equal to 2; and i is an integer no less than 2 and no larger than n. The vacuum processing chamber may be a plasma deposition chamber or a plasma etching chamber.

Another aspect of the present invention relates to an RF matching network for use with a vacuum processing chamber which comprises, a first frequency RF input port connected to a first frequency RF generator; a second frequency RF input port connected to a second frequency RF generator; and an output port that outputs the energy of one or multiple RF generators to the vacuum processing chamber, and wherein the first frequency is higher than the second frequency. Between the first frequency RF input port, and the output port, is a first circuit, which has a high impedance relative to the output port at the second frequency; and between the second frequency RF input port, and the output port is a second circuit which has a high impedance relative to the output port at the first frequency. In the present invention, the first circuit is electrically connected to the first frequency RF generator, and when measuring from the output port to the first circuit, it has a first impedance at the ith frequency, and wherein when measuring from the output port in the opposite direction to the first circuit, it has a second impedance at the ith frequency. There is a substantial conjugate match between the first impedance and the second impedance.

In the present invention, the first circuit and the second circuits each respectively comprise a capacitor; an inductor; and a grounding capacitor, and wherein the capacitor is in series with the inductor, and further is electrically connected in series with the grounding capacitor. The capacitor and the grounding capacitor are fully or partially variable capacitors. As discussed above, the connection of each circuit can be L-type, inverse-L type, T-type, or π-type. Further, the ratio between the first frequency and the second frequency is greater than or equal to 5. Additionally, between the first circuit output port, and the vacuum processing chamber, a conducting connector is connected in series. The conducting connector has an end tip of which can be a connection of one or multiple branches to the lower electrode of the vacuum processing chamber. The clearance or space between wires of the inductor of the second circuit is larger at the end of the inductor closest to the output port, than at the opposite end, and which is closest to the second frequency RF input port.

Another aspect of the present invention is to provide a method for supplying RF energy to a vacuum processing chamber, and which solves the previous problems of heating or even burning up of RF generators caused by power transmission between high frequency and low frequency RF generators which are coupled to RF matching network.

In order to realize this objective, the following methodology is provided for supplying RF energy to a RF matching network of a vacuum processing chamber comprising the steps of connecting a first frequency RF input port to a first frequency RF generator, and connecting a second frequency RF input port to a second frequency RF generator. The methodology includes further steps of providing an output port that outputs the energy of multiple RF generators to the vacuum processing chamber, and wherein the first frequency is higher than the second frequency; providing a first circuit between the first frequency RF input port and the output port, and wherein the first circuit has a high impedance relative to the output port at the second frequency; providing a second circuit between the second frequency RF input port and the output port, and wherein the second circuit has a high impedance relative to the output port at the first frequency. In the present methodology, the first circuit is electrically connected to the first frequency RF generator, and the method includes another step of measuring a fist impedance from the output port to the first circuit at the ith frequency; and measuring a second impedance from the output port, in the opposite direction, to the first circuit at the ith frequency. In the present methodology, there is a substantial conjugate match between the first impedance and the second impedance.

In the methodology described above, the first circuit and the second circuit respectively comprise a capacitor; an inductor; and a grounding capacitor; and wherein the capacitor is in series with the inductor, and further electrically coupled in series with the grounding capacitor. The capacitor and the grounding capacitor are fully or partially variable capacitors. Further, the electrical connection of each circuit can be L-type, inverse-L type, T-type, or π-type. Additionally, the ratio between the first frequency and the second frequency is larger than or equal to 5. As earlier noted, between the first circuit output port and the vacuum processing chamber is a conducting connector. The conducting connector is connected in series, and further has an end tip of which can be a connection of one or multiple branches to the lower electrode of a vacuum processing chamber. The clearance or space between wires of the inductor of the second circuit is larger at the end closest to the output port, as compared to the end closest to the second frequency RF input port.

In the present invention, by utilizing the matching network, the impedance of the respective matching circuits is a substantially conjugate match to the impedance of the vacuum processing chamber. An optimum energy input ratio is achieved, thus energy input efficiency is improved and heating of the circuit is reduced or avoided. Meanwhile, the combination of the impedances of the respective components in the matching network forms high-pass and low-pass filters. By guiding the input energy direction with the impedance of circuits, the input energy is fully utilized. The problem of heating or even burning up caused by power transmission between high frequency and low frequency RF generators is also avoided. In the present invention, the use of inductors with non-uniform clearances or spaces between wires, reduces the parasitic capacitance of the inductor. The heating of the inductors is also avoided while retaining the compactness of the inductor. The present invention has a reduced weight and small loss, and no supplemental cooling is needed, thus saving costs in both manufacturing and application.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
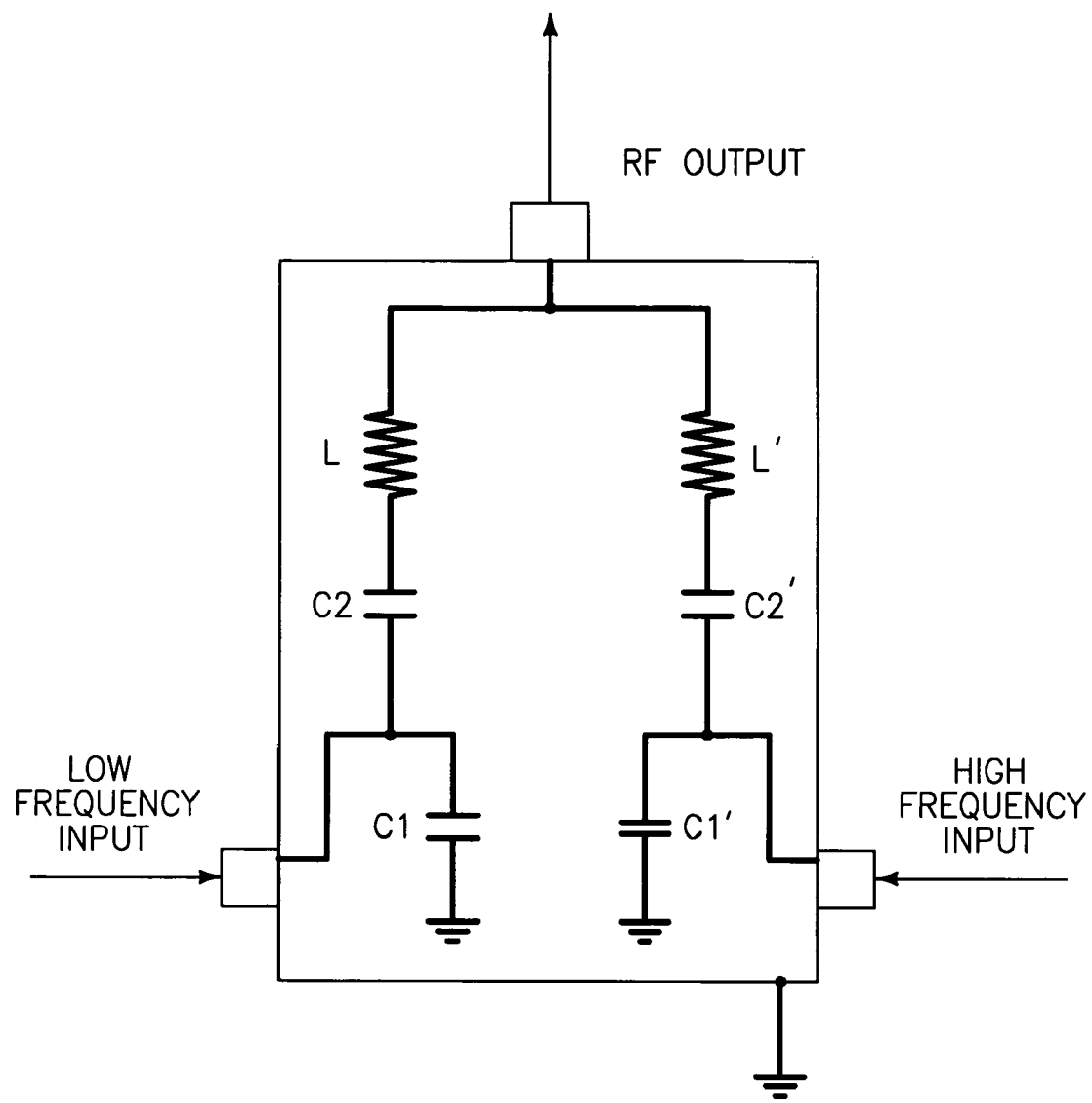
FIG. 1 is a schematic diagram of the structure of a RF matching network of the present invention.

FIG. 1 is a schematic diagram of the structure of a RF matching network for use with a vacuum processing chamber of the present invention. As shown in the figure, this embodiment has two RF inputs, one being the high frequency input part, the other being a low frequency input part. There are overall three ports in the RF matching network, and wherein two are input ports, namely the high frequency input port connected to the high frequency RF generator, and the low frequency input port connected to the low frequency RF generator, and an RF output port outputting the energy of multiple RF generators to the vacuum processing chamber. The RF matching network of the vacuum processing chamber can be divided into a low frequency part and a high frequency part, and wherein these two parts are joined at the output port with a single connection point. The high frequency part comprises a grounded capacitor C1'; a capacitor C2; and an inductor L'. Further, the low frequency part comprises one end which is grounded through a capacitor C1, and the other end connected to a capacitor C2, which is connected in series to an inductor L, and to the output port through the inductor L. In the low frequency part, inductor L, capacitor C1 and capacitor C2 form a low pass filter.

In the high frequency part, inductor L', the grounding capacitor C1' and capacitor C2' form a high pass filter. In the case that the frequency of the high frequency input is far higher than the frequency of the low frequency input, namely the frequency of the high frequency input is at least 20 times higher than the low frequency input, then, under those circumstances, and due to the characteristics of the high pass filter, and the impedance characteristics of the vacuum processing chamber under high frequency input, a minor inductance is needed by the high frequency part to realize the conjugate match between the overall matching network and the vacuum processing chamber as claimed herein. It is also feasible, under some circumstances, to provide no physical inductor in the high frequency part, but rather use a conducting piece, such as a connection wire, with a conducting connector which extends from the RF output port, to the lower electrode of the vacuum processing chamber. This takes the place of the inductor. In this arrangement, the self-inductance of the conducting piece, and conducting connector are substantially equivalent to an inductor. In this case, the grounding capacitor C1' can be replaced by the parasitic capacitor between the conducting piece, the conducting connector and ground. Because the parasitic capacitor C1' and L' are minor in value, and not easily tuned, capacitor C2' in the high frequency part can be provided as a variable capacitor in order to adjust the impedance of the circuit.

The value of the capacitor and the inductor can be estimated from the frequencies of the high frequency and low frequency part. Also, the ideal impedance can be obtained by selecting the value of capacitor C1. It will be recognized that these networks, consisting of capacitors and inductors, have a complex impedance themselves. Therefore, with the self-resistance of circuit components and wires, it is possible, by selecting and adjusting the values of the components of the matching networks, and when the low frequency part is connected to the low frequency RF generator, that the resulting impedance under low frequency and when measured from the output port to the low frequency part, is a substantial conjugate match to the other impedance under low frequency, and when measured from the output port and in the direction opposite to the low frequency part. When the high frequency part is connected to the high frequency RF generator, the impedance under high frequency measured from the output port to the high frequency part, is a substantial conjugate match to the other impedance under high frequency, and when measured from the output port and in the direction opposite to the high frequency part.

Figure 2:
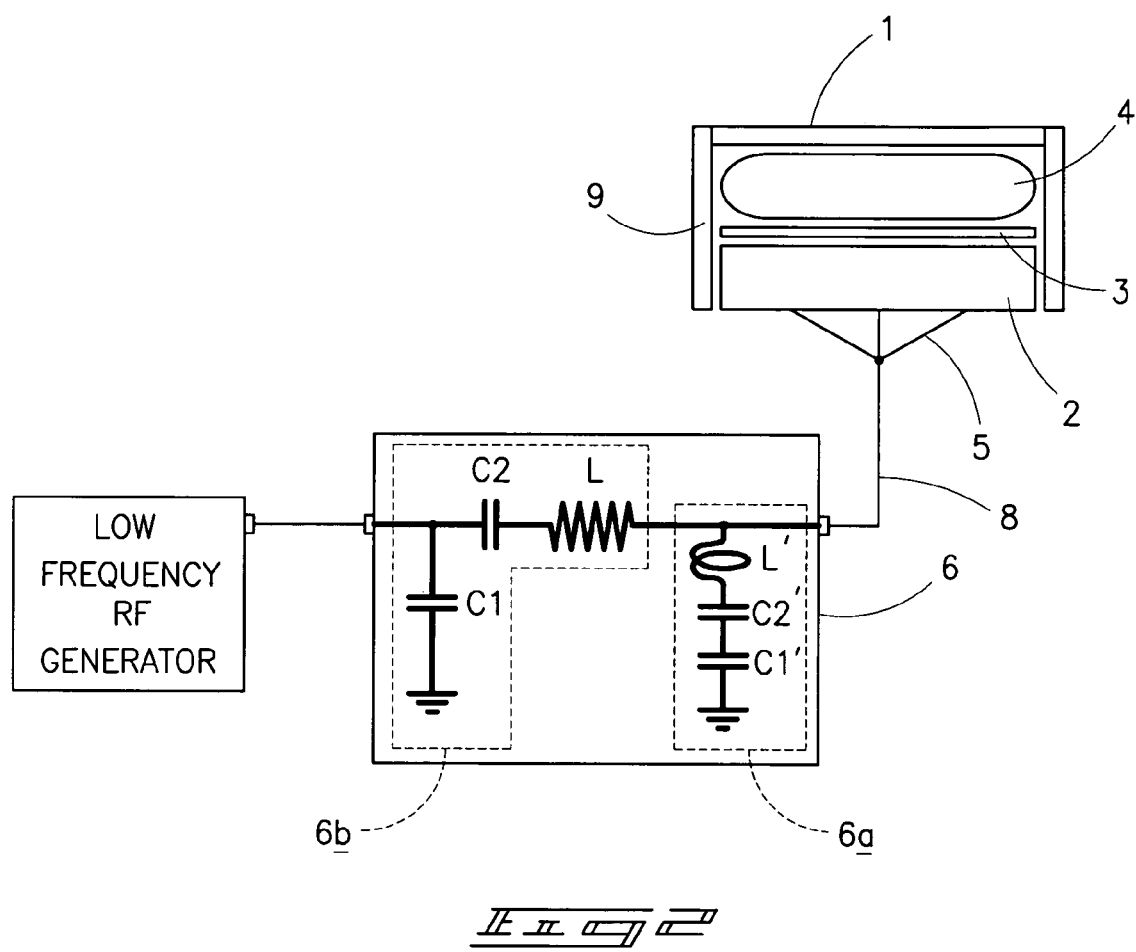
FIG. 2 is a schematic diagram of the vacuum processing chamber system applied in the present invention and measuring from the view of low frequency.

FIG. 2 is a schematic diagram of the vacuum processing chamber system of the present invention, and when measured from the view of low frequency. The vacuum processing chamber system in FIG. 2 comprises three major parts, that is, the low frequency RF generator, and the high frequency RF generator (not shown in the figure); the RF matching network; and the vacuum processing chamber. The low frequency RF generator is connected to the RF matching network. The RF matching network comprises a high frequency part, and a low frequency part. The RF matching network is electrically connected with the vacuum processing chamber, and sends RF energy to the vacuum processing chamber. The vacuum processing chamber comprises an upper electrode 1, and a lower electrode 2. Semiconductor workpiece 3 to be processed is placed above the lower electrode 2. Plasma 4 is generated between the upper and lower electrodes and processes the semiconductor workpiece 3. At one end close to the lower electrode 2 a connecting wire extends between the RF matching network, and the lower electrode 2 of the vacuum processing chamber. As seen, there is one conducting connector 5 with multiple branches connected to the lower electrode 2. This conducting connector 5 is used as one part of the equivalent impedance to supplement any insufficiency of the impedance of the RF matching network.

In the RF matching network as seen in FIG. 2, and after the low frequency RF energy is generated by the low frequency RF generator, it arrives at the output port through the circuit which consists of capacitor C2, and inductor L. Then the RF output may have two branches or ways to go, namely inputting into the vacuum processing chamber or inputting into the high frequency part. The high frequency part comprises parasitic capacitor C1'; capacitor C2'; and inductor L'. As the parasitic capacitor C1', capacitor C2' and inductor L' in the high frequency part have been configured, therefore, for the low frequency RF input, the impedance of the high frequency part is much greater than that of the vacuum processing chamber processing chamber. Therefore, most of the energy of the low frequency RF generator is inputted into the vacuum processing chamber. Furthermore, by selecting proper values for the capacitor C2', the energy inputted into the high frequency part can be reduced below 2%.

Figure 3:
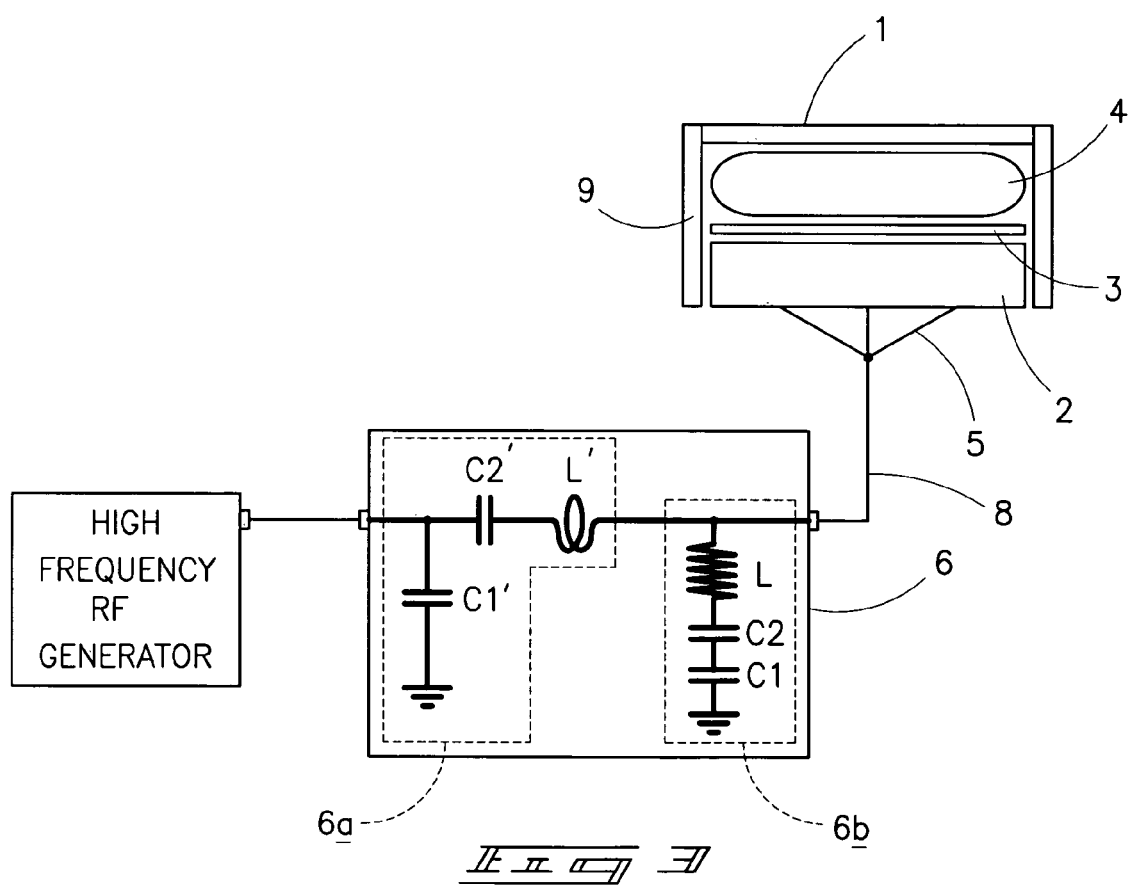
FIG. 3 is a schematic diagram of the vacuum processing chamber system applied in the present invention and measuring from the view of high frequency.

FIG. 3 is a schematic diagram of the vacuum processing chamber system applied in the present invention when measured from the view of high frequency. In the RF matching network as seen in FIG. 3, after the high frequency RF energy is generated by the high frequency RF generator, it arrives at the output port through the circuit consisting of capacitor C2', and inductor L'. Then the RF output may have two branches or ways to go, namely inputting into the vacuum processing chamber or inputting into the low frequency part. The low frequency part comprises parasitic capacitor C1; capacitor C2; and inductor L, and wherein inductor L, and capacitor C2 are connected in series, and are further electrically connected to the low frequency RF generator (not shown in the figure), and with one end of capacitor C1 being connected to capacitor C2, and the other end being grounded. With this circuit configuration, and plusing the estimated values of capacitors, and the inductor, and by further adjusting the value of capacitors, it can be realized that for the high frequency RF input, the impedance of the low frequency part is much greater than that of the vacuum processing chamber. Therefore, most of the energy of the high frequency RF generator is inputted into the vacuum processing chamber. Furthermore, by selecting a proper value for capacitor C1, the energy inputted into the low frequency part can be reduced below 2%.

The capacitors and inductors of the present invention can be fully or partially variable, and the position of the series connection of the capacitors or inductors can be varied. The capacitors and inductors can be either single or multiple.

In the present invention, the combination of the impedances of the components in the matching network is skillfully used. More specifically, the input direction of energy is guided by the inter-isolation characteristics of the circuit itself.

In the case of an application of high power input of high frequency, even if only energy of below 2% is inputted into the low frequency part, immediate damage to the components in the low frequency part typically results. This is particularly true for inductor L, because the high frequency input can generate parasitic capacitors between the wires of inductor L to the ground, and further promote the impedance of inductor L. Therefore, much energy is concentrated on inductor L, making the temperature rise sharply, until L is burned.

Figure 4:
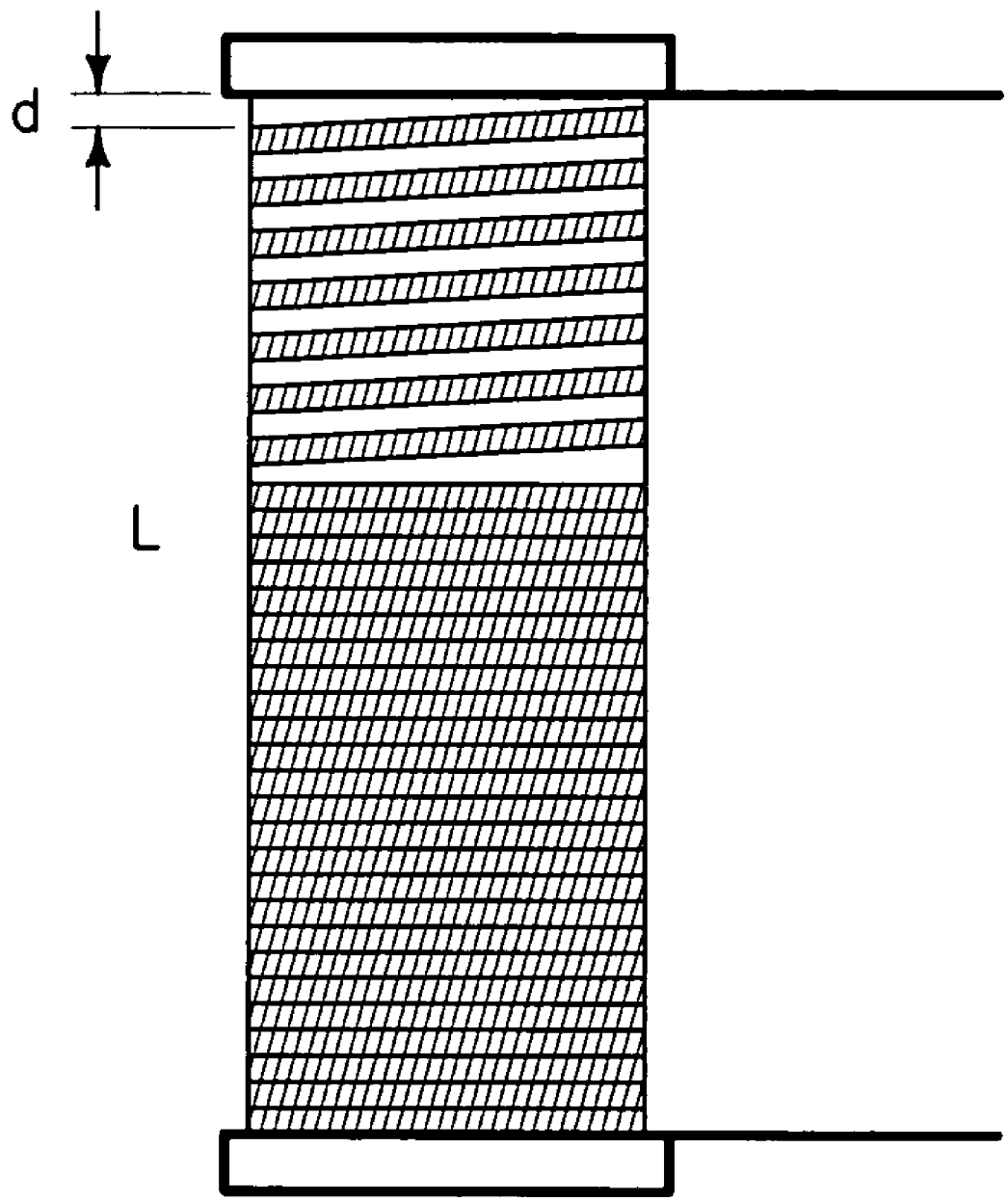
FIG. 4 is a schematic diagram of the structure of an inductor used in the RF matching network of the present invention.

Referring now to FIG. 4, in order to solve this problem, one method is to increase the clearance d between the wires of the inductor L, thus the value of parasitic capacitors will be reduced substantially, and which avoids the concentration of energy on inductor L. But this feature is not in conformity with the aim of miniaturization of the matching circuits in the present invention. Actually, only the parasitic capacitance of the inductor coil closest to the high frequency input inductor needs to be reduced. As part of the energy has been consumed by the end closest to the high frequency input, the coil of the other, opposite end, will not be burned. Thus, there is no need to increase the clearance, d, between its wires. Therefore, a preferred embodiment of the present invention as shown in FIG. 4, includes increasing the clearance or space d between wires of the end closest to the output port or high frequency input of inductor, while keeping the other, opposite end, closest to the low frequency input port unchanged, thus forming an inductor L with non-uniform clearances or spaces between wires.

The vacuum processing chamber of the present invention includes various semiconductor workpiece processing equipment which employ plasmas, such as, for instance, plasma deposition chambers, and plasma etching chambers, etc.

The teachings of the present invention can also be applied to vacuum processing chambers with multiple RF inputs. In the present invention, the RF matching network of a vacuum processing chamber includes n (n is larger than or equal to 2) RF input ports. The $1^{st}$ to nth RF input ports are connected respectively with $1^{st}$ to nth RF generators. Each RF generator has a different frequency, and an output port outputs the energy of the multiple RF generators to the vacuum processing chamber, and wherein the frequencies of the $1^{st}$ to the nth RF input ports decline in sequence. Between the ith frequency RF input port and the output port is the ith circuit, and wherein the ith circuit has high impedance at the output port relative to all RF generator frequencies other than the ith frequency. When the ith circuit is connected to the RF generator with the ith frequency, and measuring from the output port to the ith circuit, it will be seen that the ith circuit has a first impedance at the ith frequency; and wherein measuring from the output port, and in the opposite direction to the ith circuit, the ith circuit has a second impedance at the ith frequency. There is a substantial conjugate match between the first impedance and the second impedance.

Figure 6:
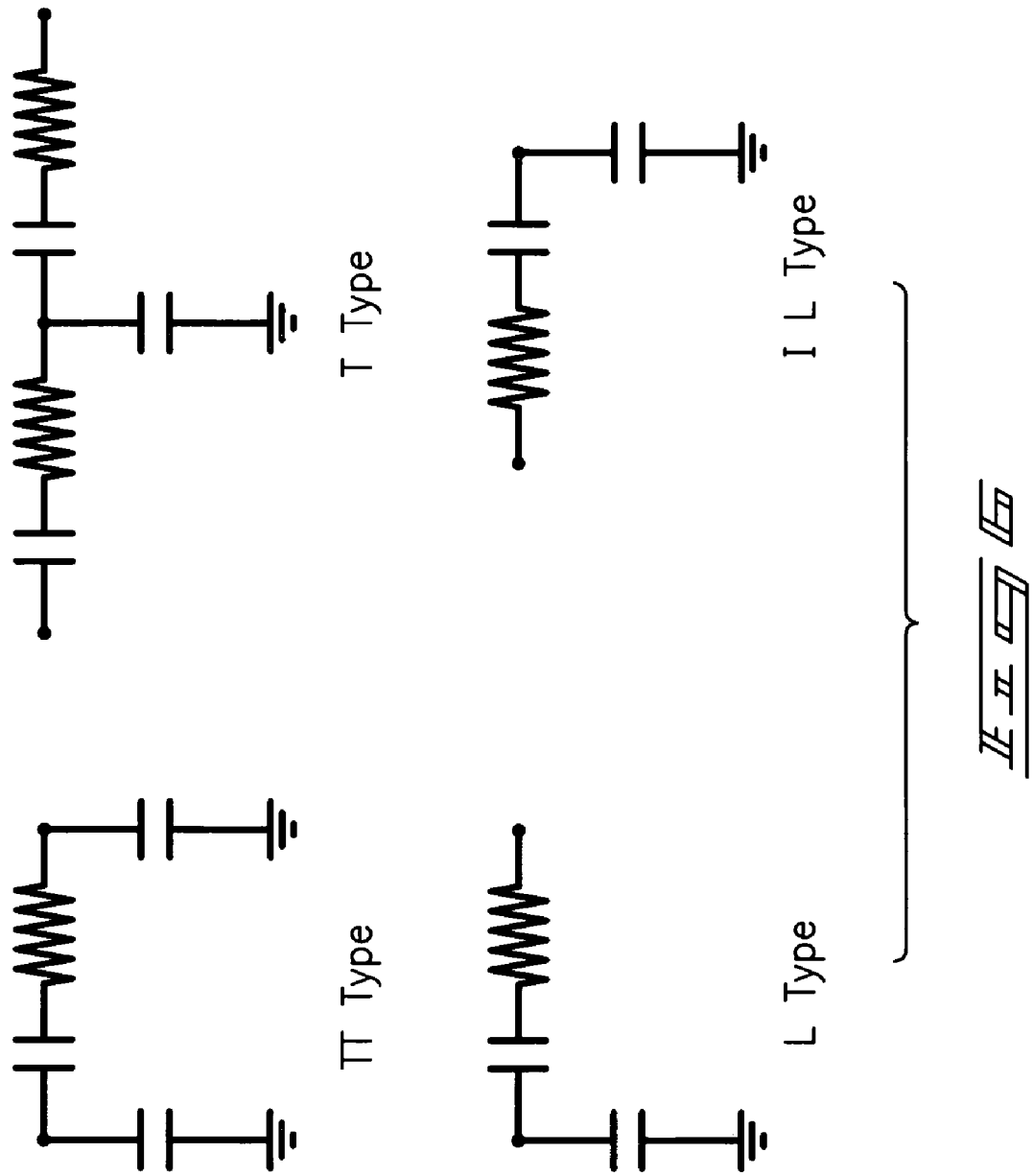
FIG. 6 is a schematic diagram of various connection methods for each circuit used in the RF matching network of the present invention.

As between two neighboring frequencies, the ratio of the high frequency to the low frequency is larger than or equal to 5. Further, each circuit comprises a capacitor; an inductor; and a grounding capacitor, and wherein the capacitor is in series with the inductor, and further electrically connected in series with the grounding capacitor. The connection of each circuit can be L-type, inverse-L type, T-type, or 7E-type, as seen in FIG. 6. In this arrangement, the vacuum processing chamber is a plasma deposition chamber or a plasma etching chamber.

Figure 5:
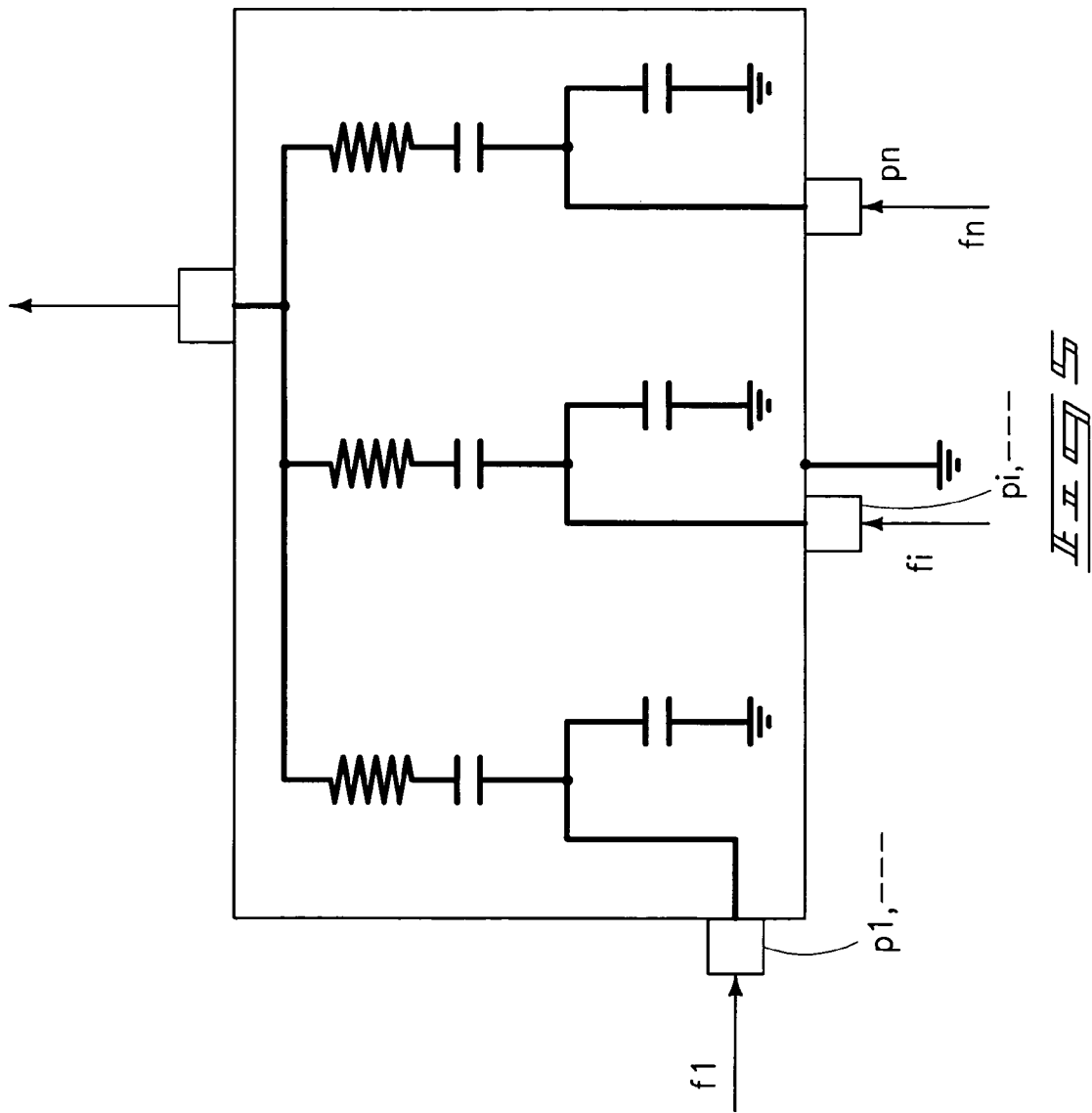
FIG. 5 is a schematic diagram of a RF matching network with multiple RF inputs of the present invention.

FIG. 5 is a schematic diagram of a RF matching network with multiple RF inputs. In this embodiment, the RF matching network of a vacuum processing chamber includes the $1^{st}$ to the nth RF input ports, namely p1 to pn in FIG. 5, and which are connected to the $1^{st}$ to the nth RF generators, respectively. Each RF generator has a different frequency, that is, from f1 to fn; and an output port that outputs the RF energy of the multiple RF generators to the vacuum processing chamber, and wherein the frequencies decline in sequence, namely, f1>fi>fn. Between two neighboring frequencies, the ratio of the high frequency to the low frequency is greater than or equal to 5.

Between the ith frequency RF input port, and the output port is the ith circuit. The ith circuit has a high impedance at the output port relative to all RF generator frequencies other than the ith frequency fi.

When the ith circuit is connected to the RF generator with the ith frequency, and measuring from the output port to the ith circuit, it has a first impedance at the ith frequency; and wherein measuring from the output port, in the opposite direction to the ith circuit, it has a second impedance at the ith frequency. There is a substantial conjugate match between the first impedance and the second impedance.

Each circuit shown in FIG. 5 includes a capacitor; an inductor; and a grounding capacitor; and wherein the capacitor is connected in series with the inductor, and then connected in series with the grounding capacitor. These capacitors or inductors can be single or multiple. The sequence of connections can also be swapped.

As shown in FIG. 6, each circuit in the present invention includes at least a capacitor; an inductor; and a grounding capacitor, and wherein the capacitor is connected in series with the inductor, and then connected in series with the grounding capacitor. The connection of the each circuit has many variations, like L-type, inverse-L type, T-type, or π-type, as earlier discussed.

The descriptions above are only some of the possible embodiments based upon the teachings of the present invention, and which shall not be used in any manner to restrict the scope of the present invention. Any replacement, combination, and/or separation which is well known in the industry on the apparatus of the present invention, and all equivalent transformations and substitutions well known in the industry on the implementation of the present invention are not beyond the teachings and protection of the present invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A RF matching network comprising:

$1^{st}$ to nth RF input ports connected respectively with a $1^{st}$ to nth RF generator, and wherein each RF generator has a different frequency, and an output port that outputs energy of the respective RF generators to a vacuum processing chamber, and wherein the frequencies of the $1^{st}$ to the nth RF input ports decline in sequence; and wherein between the ith frequency RF input port, and the output port is an ith circuit, and wherein the ith circuit has a high impedance at the output port to all RF generator frequencies other than the ith frequency; and wherein the ith circuit, when connected to the RF generator with the ith frequency, and when measuring from the output port to the ith circuit, has a first impedance at the ith frequency; and wherein when measuring from the output port, and in the opposite direction to the ith circuit, the ith circuit has a second impedance at the ith frequency; and wherein the first impedance is a substantial conjugate match of the second impedance.

2. The RF matching network as claimed in claim 1, and wherein between two neighboring frequencies, the ratio of the high frequency to the low frequency is equal to or greater than 5.

3. The RF matching network as claimed in claim 1, and wherein each of the circuits consists essentially of a capacitor; an inductor; and a grounding capacitor, and wherein the capacitor is in series with the inductor, and further coupled in series with the grounding capacitor.

4. The RF matching network as claimed in claim 3, and wherein the capacitor and the grounding capacitor are fully or partially variable capacitors.

5. The RF matching network as claimed in claim 3, and wherein the electrical connection of each of the circuits can be L-type, inverse-L type, T-type, or π-type.

6. The RF matching network as claimed in claim 1, and wherein n is an integer larger than or equal to 2, i is an integer which is not less than 2, and no larger than n.

7. The RF matching network as claimed in claim 1, and wherein the vacuum processing chamber is a plasma deposition chamber.

8. The RF matching network as claimed in claim 1, and wherein the vacuum processing chamber is a plasma etching chamber.

9. A RF matching network comprising:

a first frequency RF input port connected to a first frequency RF generator;

a second frequency RF input port connected to a second frequency RF generator; and an output port that outputs the energy of one of both of the RF generators to a vacuum processing chamber, and wherein the first frequency is higher than the second frequency; and wherein between the first frequency RF input port, and the output port is a first circuit which has a high impedance relative to the output port at the second frequency; and wherein between the second frequency RF input port and the output port is a second circuit, which has high impedance relative to the output port at the first frequency, and wherein the first circuit, when connected to the first frequency RF generator, and when measuring from the output port to the first circuit, has a first impedance at the ith frequency, and further when measuring from the output port in the opposite direction to the first circuit, has a second impedance at the ith frequency, and wherein the first impedance is a substantial conjugate match of the second impedance.

10. The RF matching network as claimed in claim 9, and wherein the first circuit and the second circuit respectively comprise a capacitor; an inductor; and a grounding capacitor, and wherein the capacitor is in series with the inductor, and further electrically coupled in series with the grounding capacitor.

11. The RF matching network as claimed in claim 10, and wherein the capacitor and the grounding capacitor are fully or partially variable capacitors.

12. The RF matching network as claimed in claim 11, and wherein the electrical connection of each circuit is selected from the group comprising L-type, inverse-L type, T-type, or π-type.

13. The RF matching network as claimed in claim 10, and wherein between the output port of the first circuit, and the vacuum processing chamber, a conducting connector having an end tip is connected in series, and wherein the end tip can be a connection of one or multiple branches to the lower electrode of the vacuum processing chamber.

14. The RF matching network as claimed in claim 10, and wherein wires forming the inductor are spaced apart, and wherein the space between the wires of the inductor of the second circuit is larger at the end of the inductor which is closest to the output port than at the end which is closest to the second frequency RF input port.

15. The RF matching network as claimed in claim 9, and wherein the ratio between the first frequency and the second frequency is larger than or equal to 5.

16. The RF matching network as claimed in claim 9, and wherein the vacuum processing chamber is a plasma deposition chamber.

17. The RF matching network as claimed in claim 9, and wherein the vacuum processing chamber is a plasma etching chamber.

18. A method for supplying RF energy to a vacuum processing chamber, comprising:

connecting a first frequency RF input port to a first frequency RF generator;

connecting a second frequency RF input port to a second frequency RF generator;

providing an output port that outputs the energy produced by the respective RF generators to the vacuum processing chamber, and wherein the first frequency is higher than the second frequency;

providing a first circuit which is located between the first frequency RF input and the output port, and wherein the first circuit has high impedance relative to the output port at the second frequency, and which is further connected to the first frequency RF generator;

providing a second circuit between the second frequency RF input port, and the output port, and wherein the second circuit has a high impedance relative to the output port at the first frequency;

measuring a first impedance at an ith frequency from the output port to the first circuit; and measuring a second impedance at the ith frequency from the output port in the opposite direction to the first circuit, and wherein the first impedance is substantially a conjugate match of the second impedance.

19. The method as claimed in claim 18, and wherein the first circuit and the second circuit each comprise a capacitor; an inductor; and a grounding capacitor, and wherein the capacitor is in series with the inductor; and further connected in series with the grounding capacitor.

20. The method as claimed in claim 19, and wherein the capacitor and the grounding capacitor are fully or partially variable capacitors.

21. The method as claimed in claim 20, and wherein the electrical connection of the each circuit can be L-type, inverse-L type, T-type, or π-type.

22. The method as claimed in claim 19, and further comprising:
providing a conducting connector which is coupled with the vacuum processing chamber; and wherein between the output port of the first circuit and the vacuum processing chamber, the conducting connector is connected in series, and wherein the end tip of the conducting connector can be a connection of one or multiple branches to a lower electrode of the vacuum processing chamber.

23. The method as claimed in claim 19, and wherein the inductor has spaced wires, and wherein the clearance between the wires of the inductor of the second circuit is larger at an end closest to the output port than at an opposite end which is closest to the second frequency RF input port.

24. The method as claimed in claim 18, and wherein the ratio between the first frequency and the second frequency is equal to or greater than 5.

25. The method as claimed in claim 18, and wherein the vacuum processing chamber is a plasma deposition chamber.

26. The method as claimed in claim 18, and wherein the vacuum processing chamber is a plasma etching chamber.

27. A RF matching network, comprising:
a first and a second RF generator which each produce RF energy having a different frequency, and wherein each RF generator supplies the RF energy to a processing chamber;
a first circuit coupling the first RF generator to the processing chamber, and which has a first high impedance relative to the frequency of RF energy provided by the second RF generator; and
a second circuit coupling the second RF generator to the processing chamber, and which has a second high impedance relative to the frequency of RF energy provided by the first RF generator, and wherein the first impedance is a substantially conjugate match of the second impedance.

* * * * *